United States Patent [19]

Noe

[11] 4,110,838
[45] Aug. 29, 1978

[54] MAGNETIC BUBBLE MEMORY PACKAGE

[75] Inventor: Terry Wayne Noe, Richardson, Tex.

[73] Assignee: Texas Instruments Incorporated, Dallas, Tex.

[21] Appl. No.: 710,763

[22] Filed: Jul. 30, 1976

[51] Int. Cl.² .............................................. G11C 19/08
[52] U.S. Cl. ........................................... 365/2; 365/28
[58] Field of Search ....................... 340/174 TF; 365/2

[56] References Cited

U.S. PATENT DOCUMENTS

| 3,770,874 | 11/1973 | Krieger et al. | 339/275 B |
| 3,996,574 | 12/1976 | Bobeck et al. | 340/174 TF |
| 4,012,723 | 3/1977 | Harper | 365/2 |

OTHER PUBLICATIONS

IEEE Transactions on Magnetics – vol. Mag. 9, No. 3; Sep. 1973, pp. 436-440.

Primary Examiner—James W. Moffitt

Attorney, Agent, or Firm—James T. Comfort; Rene' E. Grossman; William E. Hiller

[57] ABSTRACT

A magnetic bubble domain package which insures a coplanar relationship between the signal leads and the active surface of the magnetic bubble domain chip and also insures the precise location of the magnetic bubble domain chip whithin the most uniform part of the rotating magnetic field. The package utilizes a thin film of insulating material and chip means secured to the film to produce the coplanar relationship between the active surface of the chip and the signal leads. The package also includes a plastic coil carrier member which supports the inner drive coil and which may be prewound in a separate manufacturing operation. The coil carrier member is attached to the insulating material/chip means assembly in such a way as to locate the chip precisely in the center of the inner coil wound thereon. The bias field for the package is produced by two permanent magnets and two bias plates secured exterior to the drive coils, and is adjustable by means of a screw of high-permeability material located within the package.

7 Claims, 12 Drawing Figures

MAGNETIC BUBBLE MEMORY PACKAGE

BACKGROUND OF THE INVENTION

This invention relates to magnetic bubble domain chip packages and, more particularly, to a magnetic bubble domain chip package and a method of its mass assembly in which a coplanar relationship between the signal leads for the chip and the active surface of the chip is induced in order to insure more noise-free operation, and in which the chip is located in the most uniform part of the magnetic field used to drive the magnetic bubble domains thereon.

With the advancement of magnetic bubble domain technology, the need for a small, lightweight package which can be mass produced inexpensively has become paramount. Because of the special requirements and operating features of magnetic bubble domain chips, the packaging of these devices is a unique problem. Unlike semiconductors, magnetic bubble domain chips require two magnetic fields, a constant bias field perpendicular to the plane of the chip which keeps the bubble domains in a nonvolatile state, and a rotating magnetic drive field in the plane of the chip which controls the movement of bubble domains on the surface of the chip. The latter magnetic field presents the most difficult problem; the field is acquired by winding two coils in orthogonal relationship with respect to each other and then driving them with signals which are 90° out of phase with each other. Placing the coils inside a conventional package presents a problem since the signal leads to the chip must be routed through the coils, thus increasing the size of the coils and, necessarily, the power required to drive them. Coils external to the package have even larger volume and the corresponding larger power requirements and, in addition, are physically awkward, resulting in a very large final package. Consequently, one object of this invention is to disclose a package which will allow a reduction in size of the drive field coils while keeping the coils internal to the package, thus decreasing the size and weight of the final package and the power required to operate it.

Traditional wire bonding methods used in the construction of magnetic bubble domain packages result in a package in which the signal leads are not coplanar with the active surface of the magnetic bubble domain chip. Furthermore, these wire bonds do not permit the drive coils to be prewound on a coil carrier member and inserted over the chip. In this bonding method, the chip, attached to a substrate material, is bonded to conductors disposed on the substrate material with "flying leads," which do not lie flat and thus have a vertical component in the plane of the drive field, producing noise. In addition these bonds are formed one at a time, thus increasing time and expense of manufacture. Thus another object of this invention is to demonstrate an automatic, high speed bonding technique which will both facilitate this type of production procedure and insure more noise free operation.

The use of the preformed insulating film, the high speed bonding technique, and a component coil carrier member in accordance with the present invention results in an improved magnetic bubble chip package readily leading itself to a mass production method which can be implemented easily and inexpensively.

SUMMARY OF THE INVENTION

Briefly the package and the method of its production comprise an insulating film with plated conductors disposed thereon, sets of these plated conductors being formed at spaced intervals on a long strip of the film. Bonding pads on the magnetic bubble domain chips are supplied with high melting temperature metal globules and the chips are mounted on a carrier block at spaced intervals. The bonding pads of the chips and sets of conductors are brought into contact with a bonding tool and all of the bonds for each chip are formed simultaneously in a high speed assembly line operation. The chip is supported by a plate which is either part of the chip substrate or a component non-conducting plate and which is of such thickness as to raise the chip to the plane of the conductors, thus eliminating the noise components in the signal leads normally associated with magnetic bubble devices. A coil carrier member constructed of insulating material and prewound in a separate operation is then secured to the chip-insulating film assembly and the coil wound thereon is electrically connected to the appropriate leads in a further assembly line operation. In the next step of the manufacturing process, the individual chip-insulating film assemblies are separated from the strip and a prefabricated lead frame is bonded to the conductors on the insulating film using reflow bonding, and an outer coil, which may also be prewound in a separate operation, is placed over and in orthogonal relationship to the first. These coils are terminated on the proper leads of the insulating film and driven by signals through these leads which are 90° out of phase with each other to produce a rotating magnetic drive field in the plane of the bubble-supporting magnetic film of the magnetic bubble domain chip. Permanent bias magnets are attached to the ends of the outer coil facing each other and placed perpendicular to the plane of the magnetic bubble domain chip. Bias plates are attached to the top and bottom of the outer coil and parallel to the plane of the magnetic bubble domain chip. The permanent magnets, in conjunction with the bias plates above and below the magnetic bubble domain chip, produce a substantially constant magnetic bias field perpendicular to the plane of the chip. The device is encapsulated in a body of molded insulating material and a screw of high permeability material is located, during the encapsulation process, such that shunting of the bias field through the screw is possible. Other objects and features will be in part apparent and in part pointed out hereinafter.

DETAILED DESCRIPTION OF THE INVENTION

Figure 1:
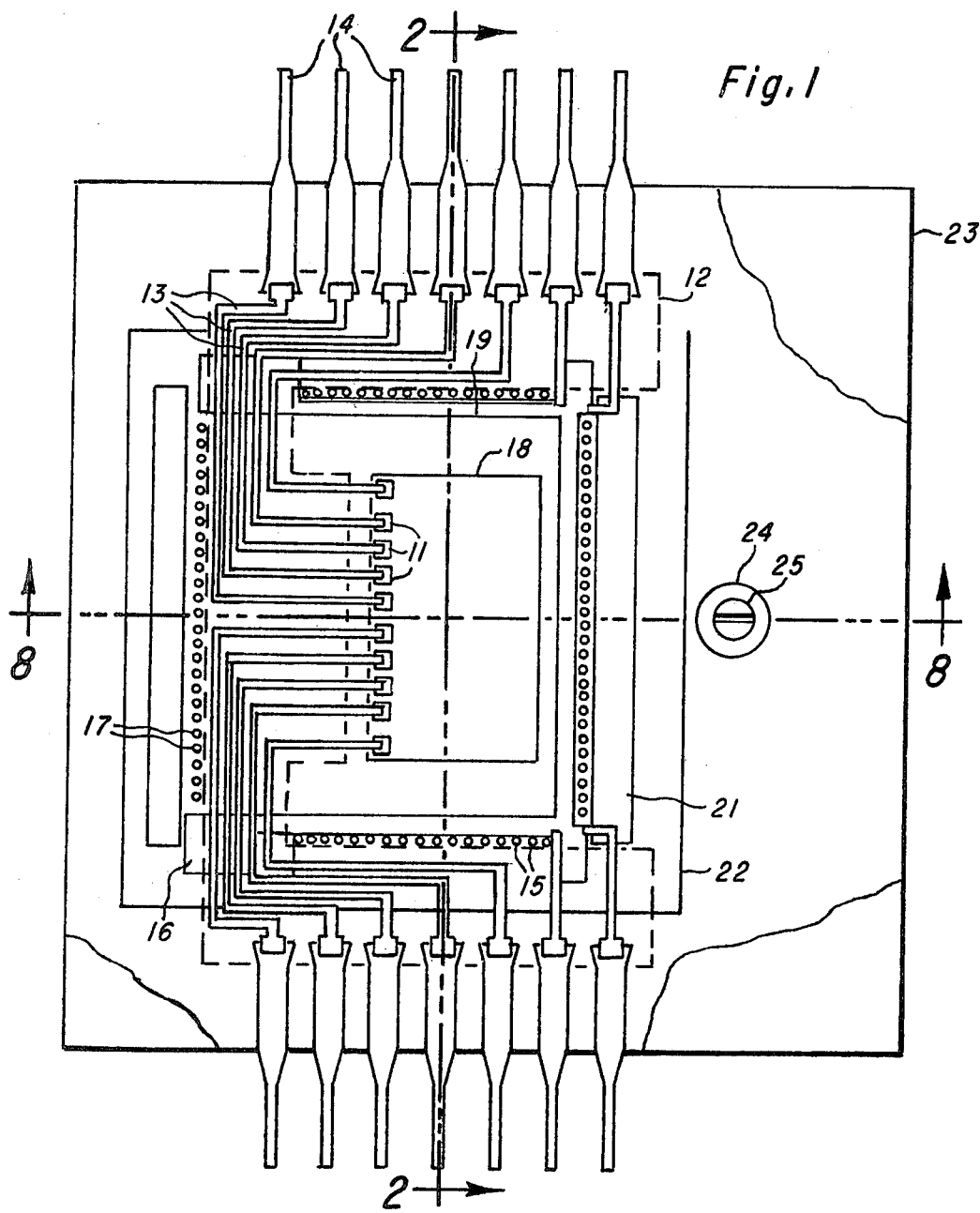
FIG. 1 is a plan view of a magnetic bubble domain package as constructed in accordance with the present invention.
Figure 2:
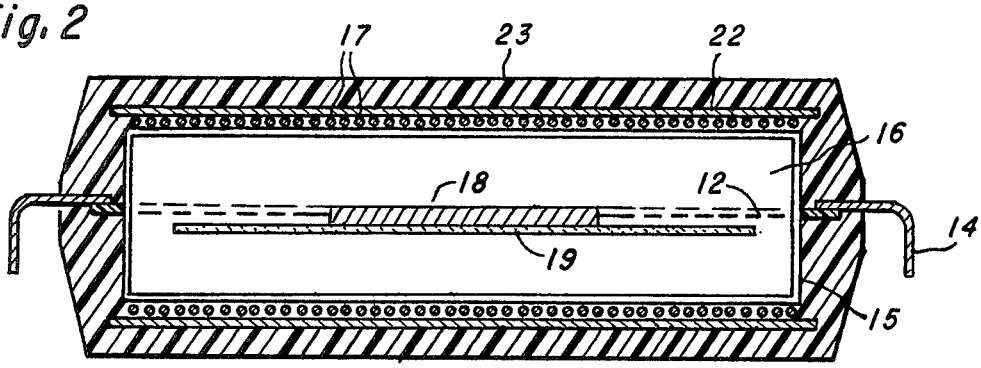
FIG. 2 is a cross-sectional view of the magnetic bubble domain package, taken along the line 2—2 of FIG. 1.
Figure 8:
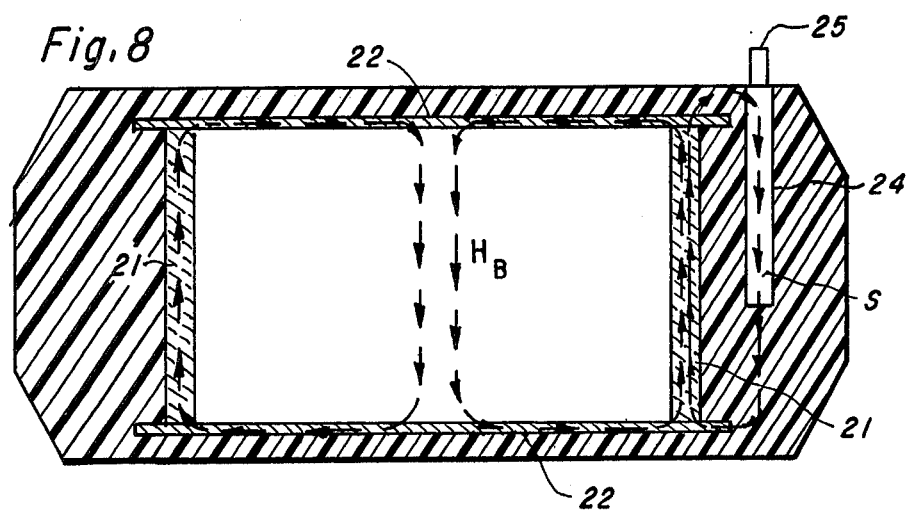
FIG. 8 is a cross-sectional view of the bias field magnetic circuit of the magnetic bubble domain package, taken along the line 8—8 of FIG. 1.

Referring more particularly to the drawings, FIGS. 1 and 2 illustrate a magnetic bubble domain package as constructed and assembled in accordance with the preferred embodiment of this invention. The package includes a magnetic bubble domain chip means 10, which comprises a single magnetic bubble domain chip 18 mounted on a support plate 19. A magnetic bubble domain chip includes a thin film of bubble-supporting magnetic material disposed on a substrate of non-magnetic material. The magnetic film has magnetically easy directions essentially perpendicular to the plane of the film. The magnetic properties of this film, e.g. magnetization, anisotropy, coercitivity, and mobility, are such that the film may be maintained magnetically saturated with magnetization in the direction out of the plane and small localized regions of polarization aligned opposite to the general polarization direction may be supported. Such localized regions are called magnetic bubble domains, and are of generally cylindrical configuration. The magnetic bubble domains are manipulated by a rotating magnetic drive field in the plane of the active bubble-supporting magnetic film of the chip, the bubbles moving along an overlay pattern of magnetizable material such as permalloy which is disposed on the surface of the chip. The bubbles are created, replicated, and destroyed to perform logical functions, these operations being controlled by circuitry external to the chip, and supplied by signal leads bonded to the overlay pattern on the chip via bonding pads 11, which are also disposed on the active bubble-supporting magnetic film of the chip. Support plate 19 is substantially rectangular and of larger dimensions than the magnetic bubble domain chip 18, and may either be part of the chip substrate or a separate component constructed on any suitable nonconducting material, a plastic or a ceramic material such as $Al_2O_3$ being examples thereof. Support plate 19 is of such a thickness as to insure that the chip is both located at the geometric center of the drive coils and coplanar with the pattern of conductors disposed on the insulating material. Because the rotating magnetic drive field used to manipulate magnetic bubble domains is supplied by coils surrounding the chip, gaining electrical access to the bonding pads 11 becomes a significant problem. In this case, a thin film of insulating material 12, the features of which are described in more detail hereinafter, is used to gain electrical access to the bonding pads 11 through the coils. Insulating film 12 is provided with a pattern of electrical conductors 13 which are bonded to the chip in a bonding operation to be described in more detail hereinafter. External conducting leads 14 are also bonded to the pattern of electrical conductors 13 and provide external access to the chip 18 after the package is completed. A first or inner coil, 15, is constructed by winding insulated magnet wire around a preformed coil carrier member 16 of insulating material. The coil may also be formed of a piece of insulating film with a metal pattern disposed thereon, said film being wrapped around carrier member 16 to form inner coil 15. The coil carrier member, to be described in more detail hereinafter, is manufactured as a separate manufacturing procedure. The coil carrier member 16 with the inner coil 15 wound thereon is then slipped over the film of insulating material 12 and the magnetic bubble domain chip means 10 in such a way as to precisely locate the magnetic bubble domain chip 18 centrally within the coil 15 as shown in FIG. 2. A second or outer coil 17, similar in construction to inner coil 15, is wound around and in orthogonal relationship to inner coil 15. The two coils may either be terminated directly on four of the external conducting leads 14 or on four of the electrical conductors 13 disposed on insulating film 12 as shown in FIG. 1. External electrical signals may then be supplied from a power source through the appropriate leads 14 to provide current in the coils. The external electrical signals are characteristically sinusoidal signals which are 90° out of phase with each other, and, since coils 15 and 17 are wound orthogonally, a rotating magnetic field is produced. The magnetic field has its greatest uniformity at the geometric center of the coils, where the active bubble-supporting magnetic film of the magnetic bubble domain chip 18 is located. Each rotation of the field thus represents one complete bubble propagation cycle along the overlay pattern disposed on the surface of the magnetic bubble domain chip. The perpendicular magnetic field necessary to sustain the magnetic bubble domains in a nonvolatile state is supplied by a pair of permanent magnets 21 shown in FIG. 1 and a pair of bias plates 22 shown in FIG. 2. The permanent magnets 21 are constructed of a suitable magnetic material, such as indox, and are located outside the drive coils on opposite sides of the magnetic bubble domain chip 18, in parallel relation and in general registry with each other so as to be perpendicular to the planar surface of the bubble-supporting film of the chip. The bias plates 22 may be constructed of a suitable magnetizable metal alloy, an iron alloy for example, and are also located external to the drive coils 15, 17 on opposite sides of the magnetic bubble domain chip 18. The bias plates 22 are parallel and in general registry with each other, and also parallel to the active planar surface of the chip, so that permanent magnets 21 and bias plates 22 cooperate to form an open-ended rectangular box around the magnetic bubble domain chip 18 which produces a magnetic bias field perpendicular to the planar surface of the bubble-supporting film of the chip 18. Bias plates 22 and permanent magnets 21 may be permanently attached to the outer drive coil 17 using an epoxy or some other suitable adhesive to insure structural rigidity. The resulting sub-assembly including the magnetic bubble domain chip 18 is encapsulated in a body of insulating material by employing a suitable molding operation, wherein a body of molding material 23 which has a low expansion coefficient and a high glass transition temperature to insure dimensional stability and minimal stress during temperature excursions, is used to enclose the sub-assembly structure. One such suitable molding material is the advance Novolac epoxy described in U.S. Pat. No. 3,856,718. During the encapsulation process, a non-magnetic insert 24 having a threaded opening therein is positioned in close proximity to one of the permanent magnets 21 as shown in FIG. 1. Insert 24 extends into the body of molding material in generally parallel relation to the permanent magnet 21. A screw 25 of high permeability material, such as an iron alloy, is received by the threaded opening of insert 24. Screw 25 is included to allow simple adjustment of the bias field strength via a shunting operation, as shown in FIG. 8. FIG. 8 is a cross-sectional view of the bias field circuit, the sectional view being taken along the line 8—8 of FIG. 1. Permanent magnets 21 and bias plates 22 complete a magnetic circuit to produce a magnetic field $H_B$ perpendicular to the plane of the active surface of the magnetic bubble domain chip 18. As screw 25 is tightened, part of the flux is shunted along path S as shown, thus reducing field $H_B$. This method insures that the perpendicular magnetic bias field is adjustable to the proper field strength for the particular chip and drive coils after assembly.

Figure 3:
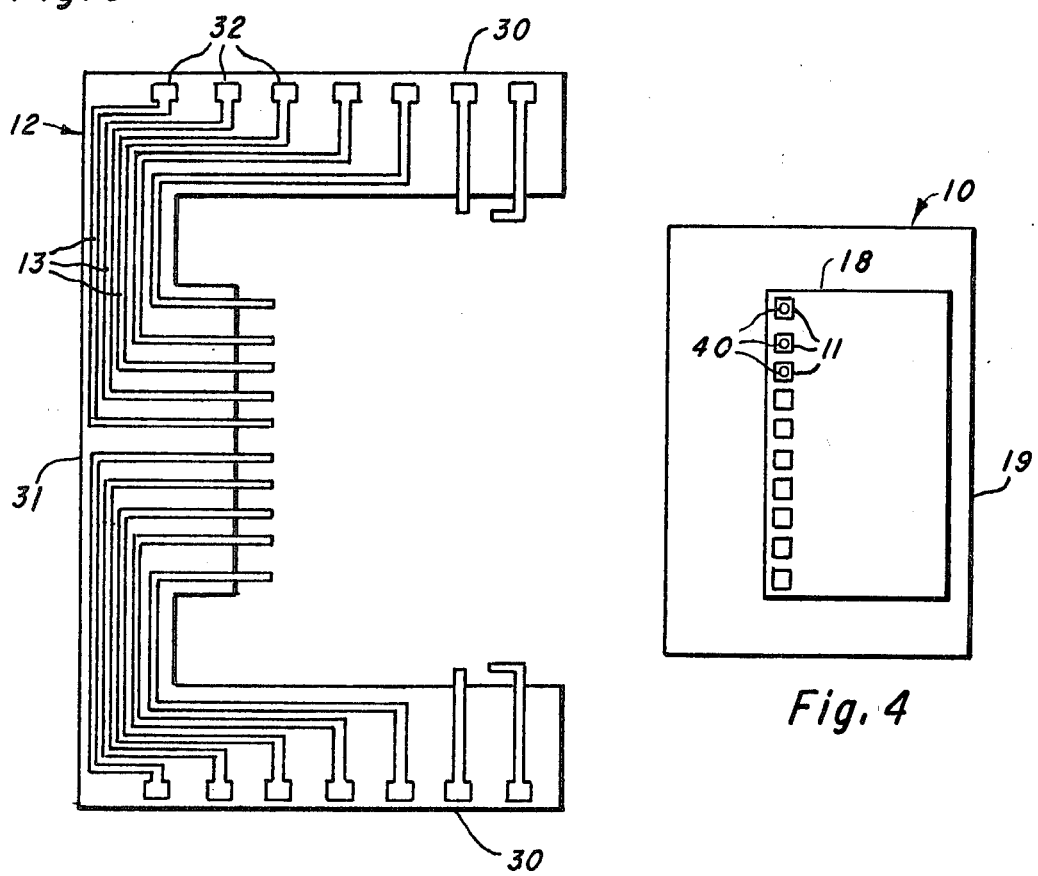
FIG. 3 is an enlarged plan view of an insulating film having electrical conductors disposed thereon and forming a component of the package of FIGS. 1 and 2.

FIG. 3 is an enlarged plan view of one embodiment of the thin insulating film, generally indicated at 12, used to provide interconnection between the chip means and the external leads. Insulating film 12 may be composed of the "Kapton" polyimide plastic film, marketed by E. I. Dupont de Nemours and Co. of Wilmington, Delaware and is formed to include two parallel arm extensions 30 connected to each other with a cross member 31. The film 12 has disposed upon it electrical conductors 13. Conductors 13 have enlarged portions or pads 32 located near the outer edges of arm extensions 30. The conductors 13 run from the enlarged pads 32 substantially parallel along arm extensions 30, then along cross member 31 perpendicular to arm extensions 30, then parallel to arm extensions 30, finally overhanging into the inner portion of the film. Conductors 13 may be constructed of any suitable conducting metal, copper being one example thereof, and are usually disposed on insulating film 12 by laminating the film with a thin plate of rolled copper, then forming a pattern of photoresist on the copper, and etching away the unwanted copper using photoetching techniques well known in the art. The conductors 13 are then plated, using a suitable electroplating technique, with a low melting temperature metal which may be used as a solder in subsequent bonding operations. Tin is a plating which is both inexpensive and well suited for this purpose.

Figure 4:
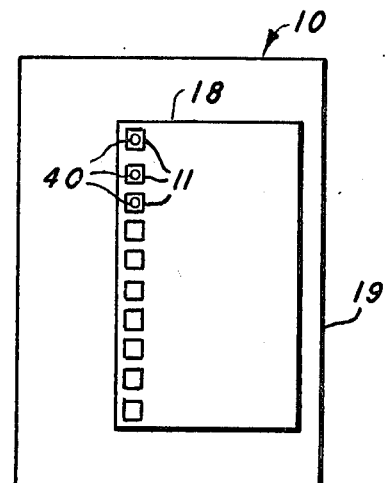
FIG. 4 is an enlarged plan view of the chip means component of the package of FIGS. 1 and 2 comprising a magnetic bubble domain chip and a support plate therefor.

FIG. 4 is an enlarged plan view of the chip means used in the preferred embodiment of this invention. The chip means is generally indicated at 10, and consists of a magnetic bubble domain chip 18 with bonding pads 11 secured to a chip support plate 19. Chip support plate 19 is substantially rectangular and of larger dimensions than the magnetic bubble domain chip, having marginal end portions extending beyond the periphery of magnetic bubble domain chip 18. If plate 19 is not part of the substrate of chip 18, the chip may be secured to the plate using epoxy or any other suitable adhesive. Each bonding pad 11 of the magnetic bubble domain chip 18 has disposed thereon a small bump, or globule, 40, of high melting temperature metal, which will be used in the bonding operation to be described in more detail hereinafter. Gold is one such metal which is suitable for this purpose, the metal being disposed on the bonding pads by a suitable electrodisposition method. When chip means 10 is secured to insulating film 12, the marginal end portions of plate 19 are attached, using epoxy or some other suitalbe sealant, to the bottom of cross member 31 of the film, the magnetic bubble domain chip 18 thus being positioned such that bonding pads 11 are located under and in direct contact with overhanging portions of conductors 13. Plate 19 is of the proper thickness so as to create a coplanar relationship between the active surface of the magnetic bubble domain chip 18 and conductors 13, thereby insuring noise free operation by eliminating any vertical current components in the plane of the rotating magnetic drive field.

Figure 5:
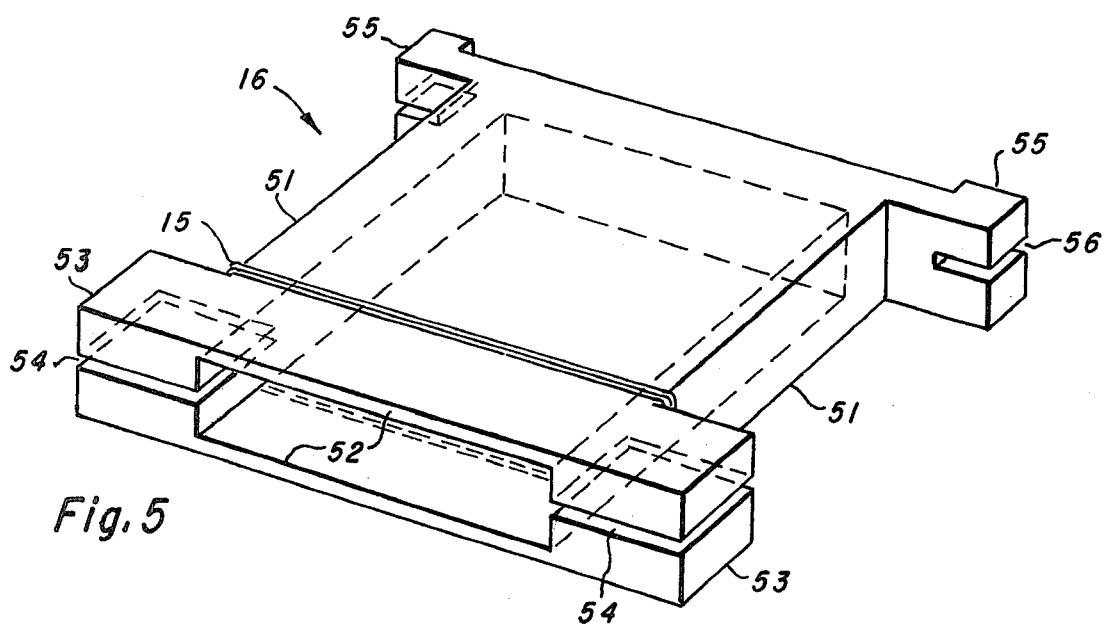
FIG. 5 is an enlarged perspective view of the coil carrier member of the package of FIGS. 1 and 2.

FIG. 5 is an enlarged plan view of the coil support means used to support the inner drive coil. A coil carrier member, generally indicated at 16, is constructed of a suitable non-conducting material, plastic and nylon being examples thereof, and is substantially sprocket shaped in form. The coil carrier member consists of two substantially parallel sidewalls 51, connected by top and bottom plates 52 to form the chip enclosure. The ends of side walls 51 are enlarged to form primary support blocks 53, and the opposite ends of side walls 51 are enlarged to form secondary support blocks 55. Primary support blocks 53 contain primary guide slots 54 and secondary support blocks 55 contain secondary guide slots 56. A first, or inner drive coil, 15, is wound onto coil carrier member 16 between primary support blocks 53 and secondary support blocks 55 around the enclosure within which magnetic bubble domain chip 18 will be positioned. The inner edges of arm extensions 30 of insulating film 12 fit into primary guide slots 54 and secondary guide slots 56 of coil carrier member 16, so that the U-shaped film 12 and sprocket shaped carrier member 16 are brought together in reverse fashion as shown in FIG. 1 to form a complete enclosure for the magnetic bubble domain chip 18, primary and secondary support blocks 53 and 55 being positioned at the outer corners of the enclosure. A bead of epoxy or some other suitable adhesive may be used to seal the magnetic bubble domain chip 18 within the coil enclosure so that molding material 23 will not contact and strain the chip. Coil carrier member 16 not only allows the use of a smaller inner drive coil 15 because the coil need not be wound around the full length of insulating film 12, but also may be formed and wound as a component, thus facilitating component mass production operations. Coil carrier member 16 also guarantees exact placement of the active bubble-supporting magnetic film of the magnetic bubble domain chip 18 at the geometric center of the inner drive coil 15, where the field is most uniform, thus insuring more reliable and effective operation of the device. The combination of the insulating film 12, sprocket shaped coil carrier member 16, and chip means 10 thus produces a substantially noise free device which is both more inexpensive to operate and to produce, and more reliable in operation.

Figure 6A:
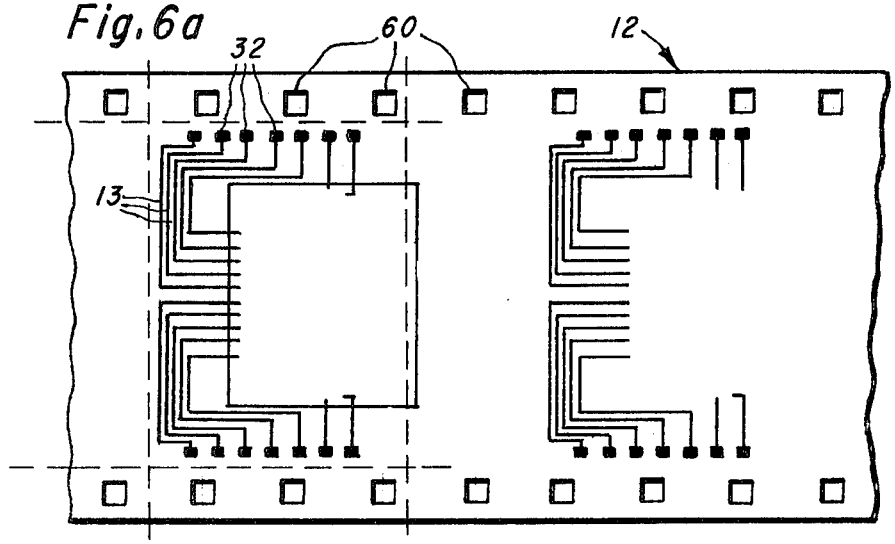
FIG. 6A is a diagrammatic view of an elongated strip of insulating material with sets of conductors predisposed thereon at spaced-apart intervals.
Figure 6B:
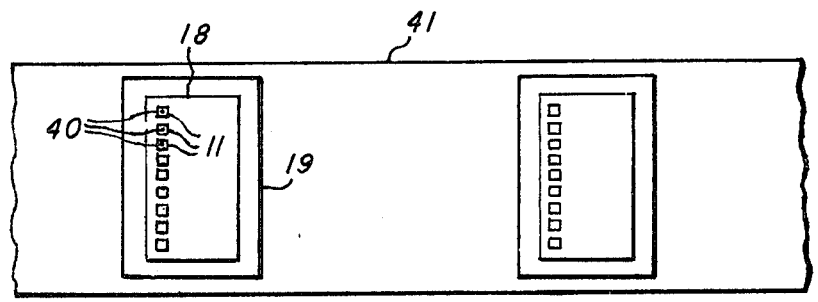
FIG. 6B is a diagrammatic view of a plurality of chip means secured to a carrier block at spaced-apart intervals.
Figure 6C:
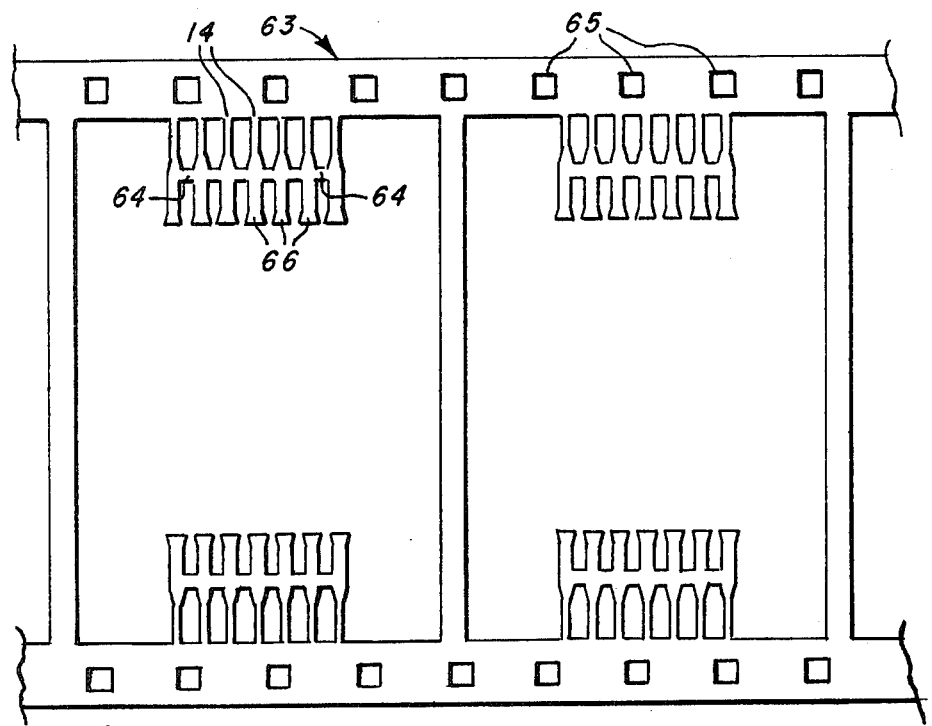
FIG. 6C is a diagrammatic view of a plurality of lead frames formed on an elongated strip of conducting material at spaced-apart intervals.
Figure 9:
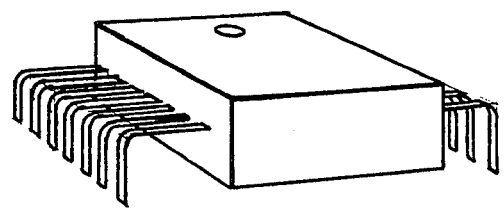
FIG. 9 shows a completed magnetic bubble domain chip package as fabricated in accordance with the method of the present invention.

A preferred method of assembly in accordance with this invention is shown in FIGS. 6A-6C. In FIG. 6A an elongated strip of insulating material 12 is shown, there being a spaced series of holes 60 extending along the opposite side margins thereof for permitting an assembly line sprocket drive and indexing procedure substantially similar to that used in the assembly of the semiconductor device of U.S. Pat. No. 3,859,718. The strip of insulating material 12 shown in FIG. 6A has already been prepared with sets of plated metal conductors 13 as described in the discussion of FIG. 3, the sets of plated conductors 13 being fabricated at spaced-apart intervals along the strip as shown. FIG. 6B shows magnetic bubble domain chip means 10, bonding pads 11 of the magnetic bubble domain chips 18 having already been prepared with high melting temperature metal globules 40 as described in the discussion of FIG. 4. The chip means 10 are mounted with wax on a carrier block 41 at spaced-apart intervals relating to the intervals between the sets of plated conductors 13 on the elongated strip of insulating material 12. The elongated strip 12 of FIG. 6A and the chip means of FIG. 6B are then brought into contact in an assembly line procedure such that the bonding pads 11 are directly under and in contact with overhanging terminals of plated metal conductors 13. Then, in a high speed bonding procedure to be described hereinafter, the overhanging terminals of plated metal conductors 13 are bonded to chip means 10 and the chip means separated from the carrier block 41 thermally. In a further assembly line operation, coil carrier members 16 with first, or inner coils 15 prewound thereon are slipped onto and attached to the chip means/insulating film assembly as described in the discussion of FIG. 5. These individual subassemblies are then separated from the elongated strip 12 along the dotted lines indicated in FIG. 6A. FIG. 6C shows a strip of conducting material formed to contain a plurality of sets of the preferred lead frame 63 which is bonded to the enlarged pads 32 disposed on insulating film 12 and which provides external electrical access to the magnetic bubble domain chip 18 after encapsulation. This lead frame is substantially similar to that used in the device of U.S. Pat. No. 3,859,718; it is constructed of a copper alloy or other suitable metal which is plated with a thin layer of low melting temperature metal such as tin and contains tie bars 64 which are trimmed away after encapsulation and sprocket holes 65 to permit drive and indexing. The lead frame 63 is bonded to the chip means/insulating film assembly using a bonding technique similar to that used in U.S. Pat. No. 3,859,718. Lead ends 66 are brought into contact with enlarged portions 32 of conductors 13 on insulating film 12, and a heated bonding tool, maintained at a temperature higher than the melting temperature of the low melting temperature metal plating disposed on lead ends 66 and enlarged portions 32 of conductors 13, is bought into contact with lead ends 66 for a time sufficient to form a suitable electrical reflow bond. Further manufacturing steps ensue in which a second, or outer coil 17 is either wound around and in orthogonal relationship to inner coil 15 or is prewound and slipped over coil 15. Both coils are terminated on the proper terminals as shown in FIG. 2. Permanent magnets 21 and bias plates 22 are positioned as shown and encapsulation and lead trimming operations complete the package, the preferred embodiment of which is shown in FIG. 9.

Figure 7A:
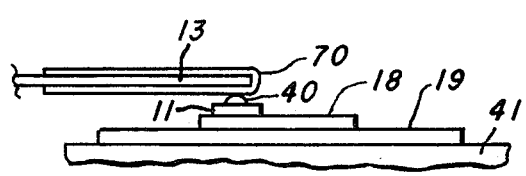
FIG. 7A is a side view showing the contact between a plated conductor on the insulating film and a bonding pad on a magnetic bubble domain chip which has a globule of high melting temperature metal disposed thereon.
Figure 7B:
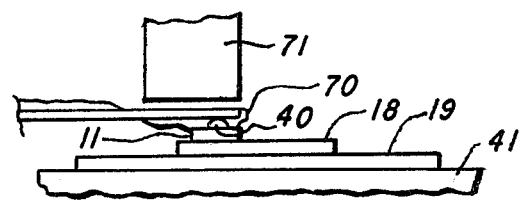
FIG. 7B is a side view showing the bond resulting from the contact of a heated bonding tool with the plated conductor of FIG. 7A.

FIG. 7 details the "bump" bonding method used in the preferred embodiment of this invention. In FIG. 7A, an overhanging terminal of conductor 13 is shown plated with a low melting temperature metal 70. Bonding pad 11 of the magnetic bubble domain chip 18 has been supplied with a bump, or globule, of high melting temperature metal 40. Chip means 10, secured with wax to carrier block 41, is brought into contact with an overhanging conductor 13 as shown. In FIG. 7B, bonding tool 71, maintained at a temperature higher than the melting temperature of metal 70, is brought into thermal contact with conductor 13 and globule 40 as shown, and is left in contact for a time sufficient to melt metal 70 over globule 40. At the same time chip means 10 is detached from carrier block 41 by melting the wax contact. These bonds have been tested and are not only more reliable than "flying lead" bonds, but are also faster forming bonds and allow the conductors 13 to be essentially coplanar with the active bubble-supporting film of the magnetic bubble domain chip 18, an important factor in magnetic bubble technology, in that the noise components usually associated with magnetic bubble domain devices are thereby eliminated. In the operation contemplated, bonding tool 71 consists of a single set of several heated elements positioned so that all of the bonds between chip means 10 and conductors 13 are completed simultaneously. This bonding method facilitates volume production of magnetic bubble devices, which is critically important in this particular technology, allows the use of semiconductor bonding tools, and produces a more noise free and reliable device.

The combination of the film of insulating material with electrical conductors disposed thereon, the bonding technique described, the elevation of the chip to a coplanar relation with the signal leads, and the prewound coil carrier member produce a new bubble package which is substantially noise free, smaller, more inexpensive to operate, and more reliable in operation. The method of combination described facilitates volume production, and insures a more inexpensive final package.

What is claimed is:

1. In a packaging assembly for magnetic bubble domain chips, the combination comprising:
   a film of insulating material having a pattern of metal conductors disposed thereon, said film of insulating material comprising a pair of parallel arm extensions and a cross member extending between said arm extensions at one end thereof and connecting said arm extensions,
   magnetic bubble domain chip means in mechanical and electrical contact with said film of insulating material and said metal conductors disposed thereon,
   a coil carrier member of non-conductive material, said coil carrier member having parallel side walls and top and bottom plates defining an enclosure therewithin in which said magnetic bubble domain chip means is received,
   said parallel side walls of said coil carrier member being respectively provided with guide slots disposed in substantially parallel relation with respect to said top and bottom plates,
   said film of insulating material being mounted externally of said coil carrier member with said arm extensions being respectively received by the guide slots in the side walls of said coil carrier member,
   at least some of said metal conductors on said film of insulating material extending into the enclosure defined by said coil carrier member at one end thereof and into electrical contact with said magnetic bubble domain chip means, and
   first and second magnetic field coils wound about said coil carrier member in orthogonal relationship with respect to each other and operable to produce an in-plane rotary magnetic field at the surface of said magnetic bubble domain chip means in response to electrical energization thereof.

2. An assembly as set forth in claim 1, wherein said magnetic bubble domain chip means comprises a magnetic bubble domain chip having a bubble-supporting magnetic film, and a non-magnetic substrate on which said bubble-supporting magnetic film is disposed and which is formed to contain an integral substantially rectangular chip support plate with marginal end portions extending beyond the edges of said bubble-supporting magnetic film.

3. An assembly as set forth in claim 1, wherein said magnetic bubble domain chip means comprises a magnetic bubble domain chip having a bubble-supporting magnetic film, and a non-magnetic substrate on which said bubble-supporting magnetic film is disposed; and a substantially rectangular chip support plate of nonconducting material with marginal end portions which extend beyond the edges of said magnetic bubble domain chip and which is secured to the bottom of said substrate of said magnetic bubble domain chip.

4. An assembly as set forth in claim 1, wherein the magnetic bubble domain chip means comprises a magnetic bubble domain chip having bonding areas provided with metal globules to which said at least some of said metal conductors are connected.

5. An assembly as set forth in claim 1, wherein said metal conductors comprise enlarged areas of metal located on said arm extensions at opposite outer edges of said film of insulating material and narrow lines of metal contacting said enlarged areas which are disposed substantially parallel to each other and overhang one edge of said film of insulating material so as to extend into electrical contact with said magnetic bubble domain chip means within the enclosure defined by said coil carrier member.

6. An assembly as set forth in claim 5, wherein said magnetic bubble domain chip means includes a bubble-supporting magnetic film having bonding areas of conductive metal provided on a surface thereof, the portions of said narrow line metal conductors overhanging one edge of said film of insulating material extending into electrical contact with said metal bonding areas on said bubble-supporting magnetic film, and the surface of said bubble-supporting magnetic film on which said metal bonding areas are provided being coplanar with the surface of said film of insulating material on which said metal conductors are disposed.

7. An assembly as set forth in claim 6, wherein said magnetic bubble domain chip means comprises a single chip having said bubble-supporting magnetic film provided thereon, and said chip being disposed in the enclosure defined within said coil carrier member at the geometric center of said first and second magnetic field coils.

* * * * *